United States Patent
Moncrieff et al.

(10) Patent No.: US 6,531,942 B2
(45) Date of Patent: Mar. 11, 2003

(54) METHOD OF COOLING AN INDUCTION COIL

(75) Inventors: Ian Moncrieff, Wotton-under-Edge (GB); Clive Luca Widdicks, Bristol (GB)

(73) Assignee: Trikon Holdings Limited, Newport (GB)

( * ) Notice: Subject to any disclaimer, the term of this patent is extended or adjusted under 35 U.S.C. 154(b) by 32 days.

(21) Appl. No.: 09/834,880

(22) Filed: Apr. 16, 2001

(65) Prior Publication Data
US 2001/0033217 A1 Oct. 25, 2001

(30) Foreign Application Priority Data
Apr. 19, 2000 (GB) .............................................. 0009565

(51) Int. Cl.[7] .............................................. H01F 27/10
(52) U.S. Cl. .............................. 336/57; 336/55; 336/61; 336/62
(58) Field of Search .............................. 336/55, 57, 61, 336/62; 29/889.72, 890.045

(56) References Cited

U.S. PATENT DOCUMENTS

| | | | | |
|---|---|---|---|---|
| 4,293,755 A | * | 10/1981 | Hill et al. | 118/50.1 |
| 4,817,706 A | * | 4/1989 | Harumi et al. | 165/263 |
| 5,049,840 A | * | 9/1991 | Gesche et al. | 333/22 F |
| 5,681,393 A | | 10/1997 | Takagi | |

FOREIGN PATENT DOCUMENTS

| | | |
|---|---|---|
| EP | 0271341 A2 | 6/1988 |
| GB | 1410147 | 10/1975 |

* cited by examiner

Primary Examiner—Karl D. Easthom
Assistant Examiner—Jennifer A. Poker
(74) Attorney, Agent, or Firm—Volentine Francos, PLLC

(57) ABSTRACT

This invention relates to a method of cooling an immersed induction coil, such as an ionizing coil used in a vacuum processing chamber. The coil 10 may comprise a coiled hollow tube 11 through which coolant can flow when pumped by a pump 13. A valve 16 is provided so that air can be passed through the tube in either direction and the direction of flow is controlled by a controller 19, which acts on the valve 16. The rate of switching of the valve 16 can be determined by a process condition or by monitoring the temperature of the downstream coolant and/or the coil.

19 Claims, 4 Drawing Sheets

METHOD OF COOLING AN INDUCTION COIL

BACKGROUND OF THE INVENTION

This invention relates to a method of cooling an immersed induction coil such as an ionising coil used in a vacuum processing chamber.

Many problems can arise if the temperature of ionising coils are not properly controlled and this is particularly true where the coils are inside the vacuum processing chamber, because in that case the adhesion of deposited material on the coil may be incomplete giving rise to damaging particles within the processing chamber. Traditionally such coils have been cooled by flowing a liquid coolant constantly along a cooling passage extending through the coil. If water is used then the cooling is if anything too efficient and the coil is kept well below the ambient temperature of the process chamber, resulting in high levels of added particles to processed wafers. Conversely, if air is used then the cooling is in principle about right, but with a coil of any length and this includes even single term coils, a substantial thermal gradient can build up along the length of the coil causing delamination of deposited material.

SUMMARY OF THE INVENTION

The present invention consists in a method of cooling an induction coil having a cooling passage extending through it, including flowing coolant through the cooling passage in the first direction and then flowing coolant through the passage in the opposite direction.

The direction may be switched periodically, with for example, the switching period being reduced the longer the process runs and additionally or alternatively it may be controlled in response to detected coil temperature. Most conveniently the method may include monitoring the down stream temperature of the coolant and/or the coil and reversing the direction when that temperature exceeds a predetermined level.

It is particularly preferred that the coolant is air or some other suitable gas.

Although the invention has been defined above it is to be understood it includes any inventive combination of the features set out above or in the following description. The invention also includes apparatus for performing the method.

BRIEF DESCRIPTION OF THE DRAWINGS

The invention may be performed in various ways and a specific embodiment will now be described in connection with the accompanying drawings in which.

DETAILED DESCRIPTION OF THE PREFERRED EMBODIMENTS

Figure 1:
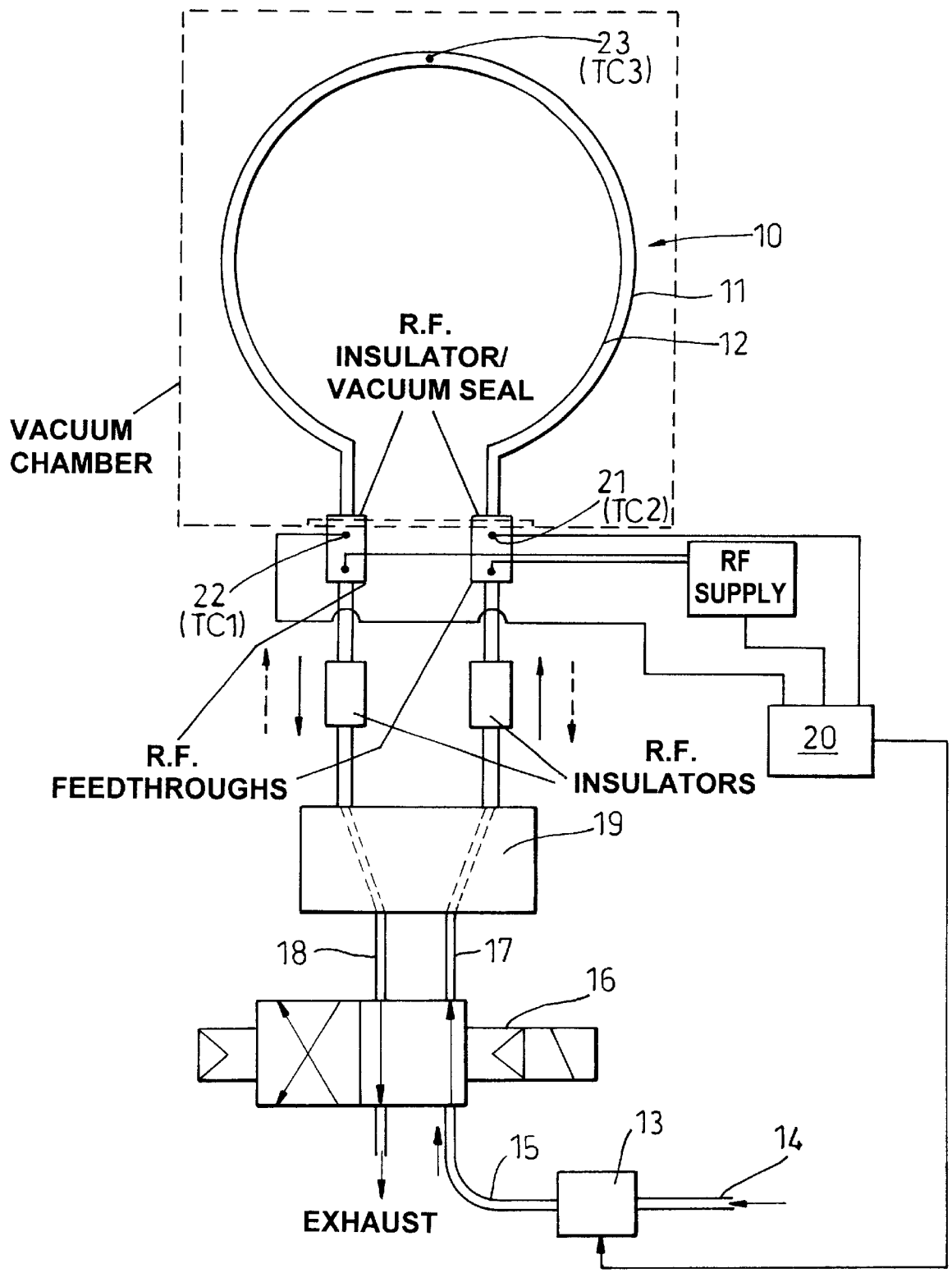
FIG. 1 is a schematic view of an induction coil and a related cooling system.

An induction coil, such as an ionising coil, is generally indicated at 10. It will be seen that it comprises a coiled hollow tube 11, which would typically be made of stainless steel. This tube 11 defines a central passageway 12 through which coolant can be flowed. A pump 13 has an air inlet 14 and an outlet 15. The outlet 15 supplies a by-directional valve 16 which is connected by pipes 17 and 18 to respective ends of the coil 10 via a heat exchanger 19. In use, depending on the setting of the valve 16, air can be passed through the tube 11 either in the direction of the solid arrows or in the direction of the dotted arrows. The setting of the valve 16 is determined by a controller 20. This controller 20 could simply control the valve 16 so that it switches at a steady rate or at a rate which is determined by the time for which the process has been running or in accordance with some predetermined profile, which is particularly suitable for the process as it's being run. However, it is particularly preferred that thermocouples 21 and 22 are provided at the ends of the coil 10 so that the "down stream" temperature of the coil can be monitored or indeed the thermal gradient along the length of the coil can be monitored. The controller 20 can then adjust the rate of switching to achieve a predetermined thermal gradient or a ore-determined down stream temperature.

It will be appreciated that the thermocouples 21 and 22 could equally be on the pipes 17 and 18 and for practical reasons this may be more convenient, even if the temperature reading is slightly less direct. Alternatively coolant temperature could be monitored. For experimental purposes an additional thermocouple was placed on the coil at the most distant point from the heat exchanger.

The controller 20 may also control pump 13 so as to adjust flow rate.

Water conducts RF unless it is de-ionised and therefore silicone oil is used. This has the ability to leak out of practically every known joint and dissolves PTFE (plumber's) tape, leaving an oily slick on the floor.

Experimental Results

Figure 2:
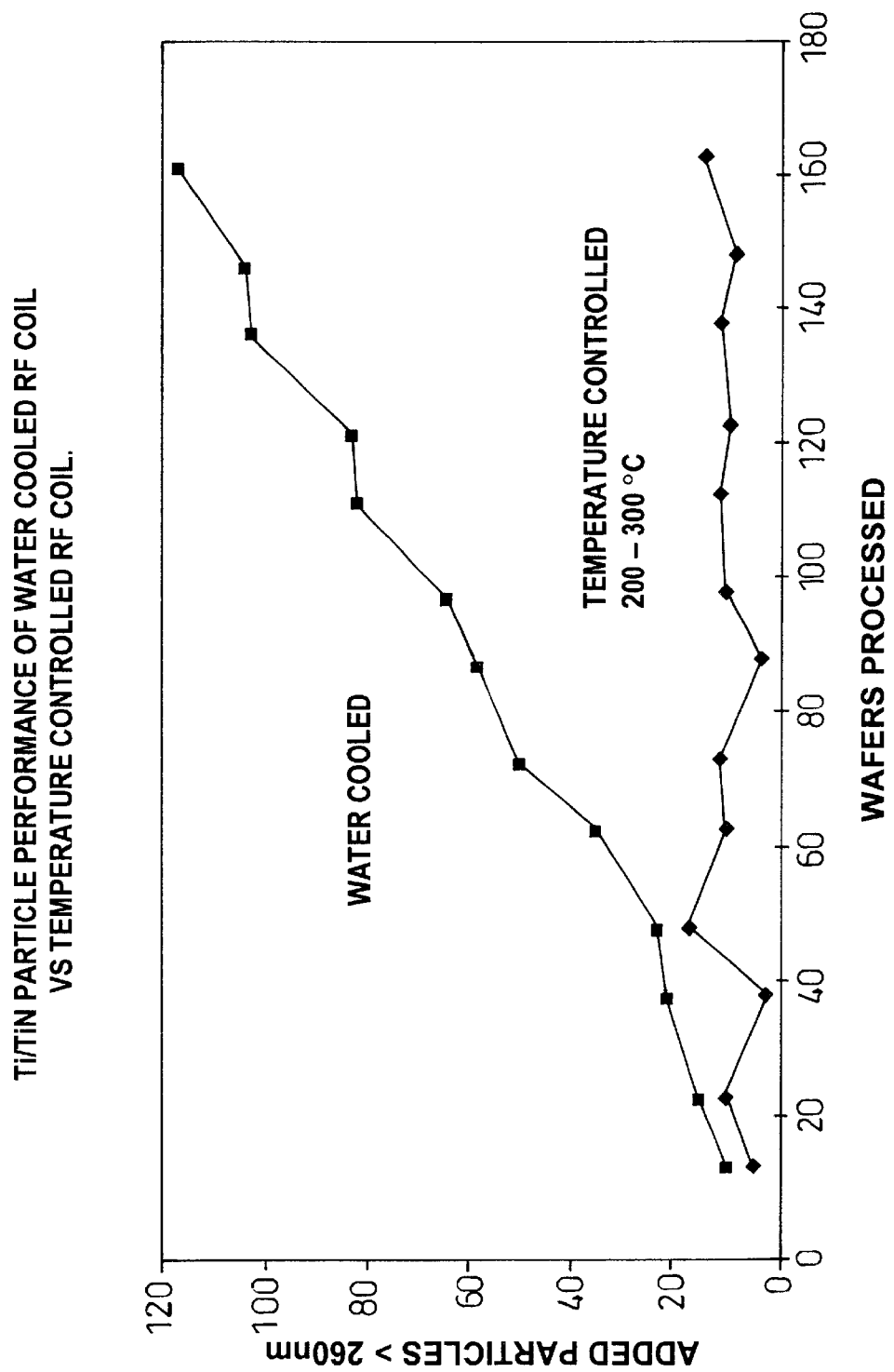
FIG. 2 is a graph showing the relationship between added particles and numbers of wafers processed for different cooling regimes.

In a desposition of Titanium Nitride it was experimentally determined that a coil temperature between 200° C. and 300° C. was preferred by reference to measured added particles upon silicon wafers—see FIG. 2. Where the coil was cooled by water at ambient temperature particle levels rapidly increased, whereas a temperature controlled coil according to this invention yielded stable low added particle levels.

Figure 3:
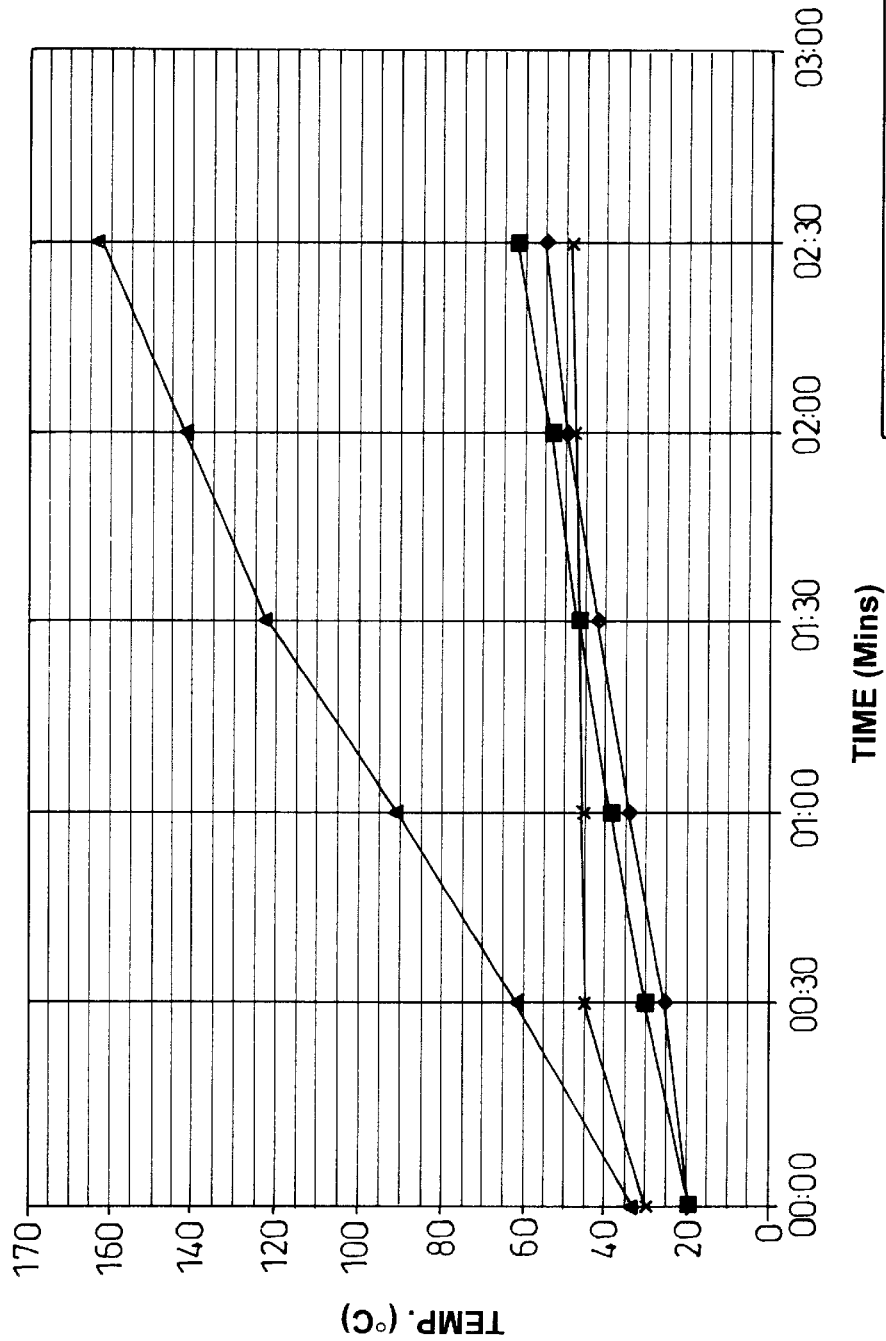
FIG. 3 is a graph indicating cooling over time under different regimes.

In FIG. 3 the temperatures at thermocouples 21, 22 are shown in uni-directional and bi-directional modes of operation. It can be seen that in bi-directional mode the temperature gradient along the coil was no more than 10° C. over a 150 second experiment, compared to a temperature gradient of 105° C. over the same period for a uni-directional mode of cooling.

Figure 4:
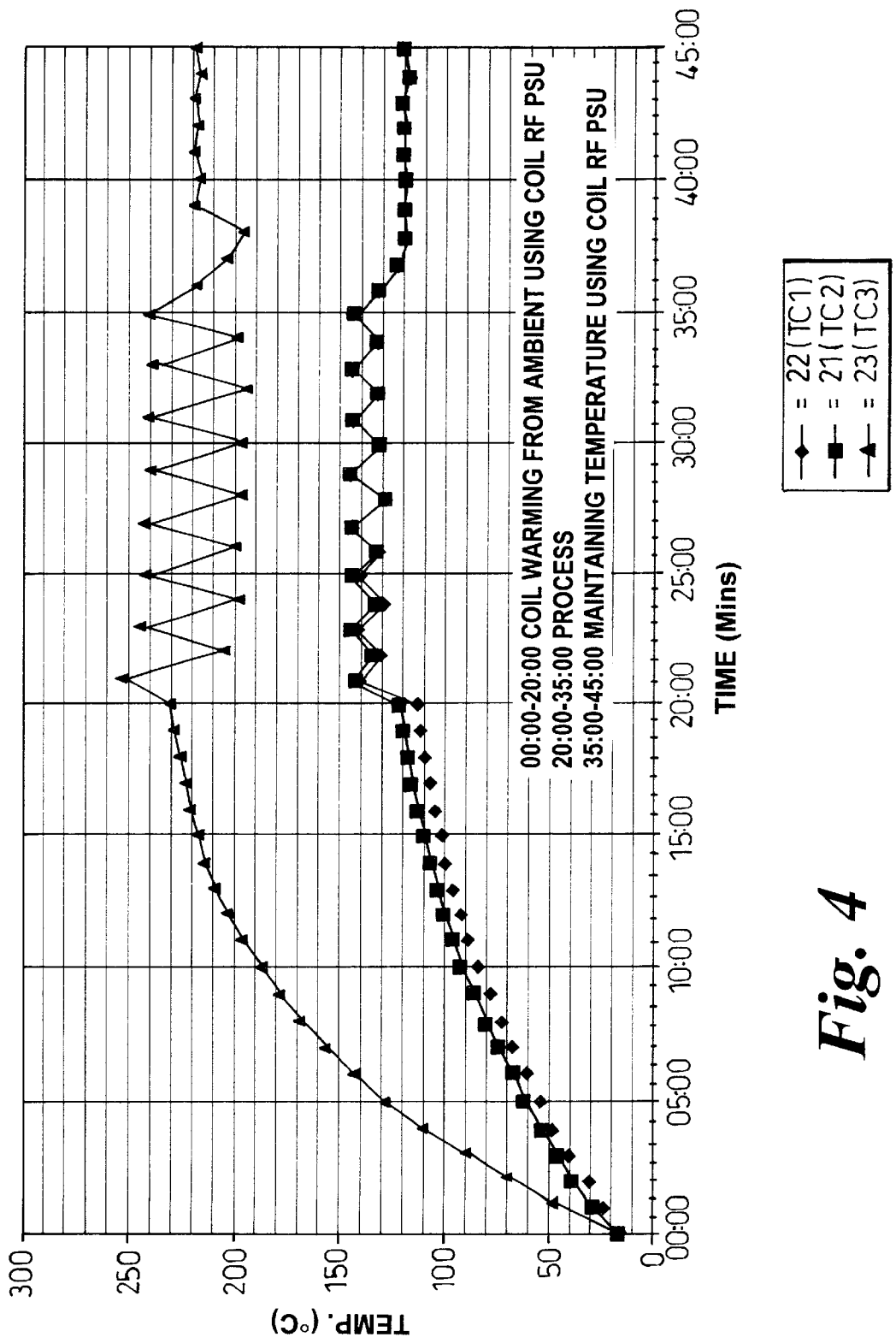
FIG. 4 is a graph corresponding to FIG. 3 when RF coil heating is present.

In FIG. 4 the temperatures at thermocouples 21, 22, 23 are shown during a process where the coil is stabilised at 220° C. with thermal cycling of less than 60° C. Note that thermocouples 21 and 22 are maintained in the RF vacuum feedthroughs and are therefore not indicative of the temperature of the coil within the vacuum process chamber.

What is claimed is:

1. A method of cooling an induction coil having a cooling passage extending there through, the cooling passage defined between a first opening at one end of the cooling passage and second opening at an opposite end of the cooling passage, said method comprising flowing coolant through the cooling passage in a first direction from the first opening to the second opening, and then flowing coolant through the cooling passage in a second direction from the second opening to the first opening.

2. The method as claimed in claim 1, further comprising switching the flowing coolant periodically between the first and second directions.

3. The method as claimed in claim 1, further comprising monitoring a temperature of the coolant in a vicinity of the second opening of the coolant passage when the flowing coolant is in the first direction, and reversing the flowing coolant to the second direction when the temperature exceeds a predetermined level.

4. The method as claimed in claim 1 wherein the coolant is air.

5. The method as claimed in claim 2 wherein the coolant is air.

6. The method as claimed in claim 3 wherein the coolant is air.

7. The method as claimed in claim 3, further comprising monitoring a second temperature of the coolant in a vicinity of the first opening of the coolant passage when the flowing coolant is in the second direction, and reversing the flowing coolant to the first direction when the second temperature exceeds a second predetermined level.

8. The method as claimed in claim 1, further comprising monitoring a first temperature of the coil in a vicinity of the second opening of the coolant passage when the flowing coolant is in the first direction, and reversing the flowing coolant to the second direction when the temperature exceeds a predetermined level.

9. The method as claimed in claim 8, further comprising monitoring a second temperature of the coil in a vicinity of the first opening of the coolant passage when the flowing coolant is in the second direction, and reversing the flowing coolant to the first direction when the second temperature exceeds a second predetermined level.

10. The method as claimed in claim 1, wherein the induction coil is located within a vacuum chamber during cooling.

11. The method as claimed in claim 7, wherein the induction coil is located within a vacuum chamber during cooling.

12. The method as claimed in claim 9, wherein the induction coil is located within a vacuum chamber during cooling.

13. The method as claimed in claim 10, further comprising supplying an RF signal to the induction coil during cooling.

14. The method as claimed in claim 11, further comprising supplying an RF signal to the induction coil during cooling.

15. The method as claimed in claim 12, further comprising supplying an RF signal to the induction coil during cooling.

16. The method as claimed in claim 1, wherein the flowing coolant is switched between the first and second directions using a bi-directional valve located between a pump and the first and second openings of the coolant passage.

17. The method as claimed in claim 16, further comprising passing the coolant through a heat exchanger located between the bi-directional valve and the first and second openings of the coolant passage.

18. The method as claimed in claim 10, wherein the flowing coolant is switched between the first and second directions using a bi-directional valve located between a pump and the first and second openings of the coolant passage.

19. The method as claimed in claim 18, further comprising passing the coolant through a heat exchanger located between the bidirectional valve and the first and second openings of the coolant passage.

* * * * *